US008114572B2

(12) United States Patent
Landry-Coltrain et al.

(10) Patent No.: US 8,114,572 B2
(45) Date of Patent: Feb. 14, 2012

(54) LASER-ABLATABLE ELEMENTS AND METHODS OF USE

(75) Inventors: Christine J. Landry-Coltrain, Fairport, NY (US); Mitchell S. Burberry, Webster, NY (US); Dennis R. Perchak, Penfield, NY (US); Kam C. Ng, Rochester, NY (US); Lee W. Tutt, Webster, NY (US); Lawrence A. Rowley, Rochester, NY (US); Linda M. Franklin, Rochester, NY (US)

(73) Assignee: Eastman Kodak Company, Rochester, NY (US)

( * ) Notice: Subject to any disclaimer, the term of this patent is extended or adjusted under 35 U.S.C. 154(b) by 0 days.

(21) Appl. No.: 12/581,926

(22) Filed: Oct. 20, 2009

(65) Prior Publication Data

US 2011/0089609 A1 Apr. 21, 2011

(51) Int. Cl.
*G03F 7/004* (2006.01)
*G03F 7/28* (2006.01)
*G03F 7/039* (2006.01)

(52) U.S. Cl. ...................... 430/270.1; 430/306; 430/944

(58) Field of Classification Search ............... 430/270.1, 430/300, 302, 306, 906, 944
See application file for complete search history.

(56) References Cited

U.S. PATENT DOCUMENTS

| | | | | |
|---|---|---|---|---|
| 3,647,446 | A * | 3/1972 | Alsup et al. | 430/306 |
| 4,323,636 | A | 4/1982 | Chen | 430/271 |
| 5,506,086 | A * | 4/1996 | Van Zoeren | 430/201 |
| 5,605,780 | A | 2/1997 | Burberry et al. | 430/278.1 |
| 5,705,310 | A | 1/1998 | Van Zoeren | 430/201 |
| 5,719,009 | A | 2/1998 | Fan | 430/306 |
| 5,798,202 | A | 8/1998 | Cushner et al. | 430/306 |
| 5,804,353 | A | 9/1998 | Cushner et al. | 430/306 |
| 6,090,529 | A | 7/2000 | Gelbart | 430/306 |
| 6,521,391 | B1 | 2/2003 | Bennett et al. | 430/275.1 |
| 6,576,401 | B2 * | 6/2003 | Teng | 430/303 |
| 6,689,538 | B2 | 2/2004 | Hoffend, Jr. et al. | 430/273.1 |
| 2003/0224160 | A1 * | 12/2003 | Murakami et al. | 428/343 |
| 2005/0118362 | A1 | 6/2005 | Kim et al. | 428/32.81 |
| 2006/0188815 | A1 * | 8/2006 | Ezure | 430/270.1 |
| 2008/0258344 | A1 | 10/2008 | Regan et al. | 264/400 |
| 2008/0261028 | A1 | 10/2008 | Regan et al. | 428/336 |

FOREIGN PATENT DOCUMENTS

| | | | |
|---|---|---|---|
| JP | 2000-238451 | * | 9/2000 |
| WO | WO 93/23253 | A1 | 11/1993 |
| WO | WO 02/22360 | A2 | 3/2002 |
| WO | 2005/084959 | | 9/2005 |

OTHER PUBLICATIONS

Machine translation of JP 2000-238451, published on Sep. 5, 2000.*

* cited by examiner

*Primary Examiner* — Anca Eoff
(74) *Attorney, Agent, or Firm* — J Larry Tucker

(57) ABSTRACT

A laser-ablatable element for direct laser engraving has a laser-ablatable, relief-forming layer that has a relief-image forming surface and a bottom surface. This relief-forming layer includes a laser-ablatable polymeric binder and an infrared radiation absorbing compound that is present at a concentration profile such that its concentration is greater near the bottom surface than the image-forming surface. This arrangement of the infrared radiation absorbing compound provides improved ablation efficiency, particularly when laser exposure is carried out adiabatically.

24 Claims, 4 Drawing Sheets

LASER-ABLATABLE ELEMENTS AND METHODS OF USE

FIELD OF THE INVENTION

This invention relates to laser-ablatable elements that can be used to prepare relief images in flexographic printing plates. This invention also relates to a method of preparing these imageable elements. This invention further relates to a method of providing flexographic printing plates.

BACKGROUND OF THE INVENTION

Flexography is a method of printing that is commonly used for high-volume printing runs. It is usually employed for printing on a variety of substances particularly those that are soft and easily deformed, such as paper, paperboard stock, corrugated board, polymeric films, fabrics, plastic films, metal foils, and laminates. Course surfaces and stretchable polymeric films can be economically printed by the means of flexography.

Flexographic printing plates are sometimes known as "relief printing plates" and are provided with raised relief images onto which ink is applied for application to the printing substance. The raised relief images are inked in contrast to the relief "floor" that remains free of ink in the desired printing situations. Such printing plates are generally supplied to the user as a multi-layered article having one or more imageable layers coated on a backing or substrate. Flexographic printing can also be carried out using a flexographic printing cylinder or seamless sleeve having the desired raised relief image. These flexographic printing cylinder or sleeve precursors can be "imaged in-the-round" (ITR), either by using a standard photomask or a "laser ablation mask" (LAM) imaging on a photosensitive plate formulation, or by "direct laser engraving" (DLE) of a plate precursor that is not necessarily photosensitive.

Generally, flexographic printing plates are produced from a photosensitive resin. A photo-mask, bearing an image pattern is placed over the photosensitive resin sheet and the resulting masked resin is exposed to light, typically UV radiation, to crosslink the exposed portions of the resin, followed by developing treatment in which the unexposed portions (non-crosslinked) of the resin are washed away with a developing liquid. Recent developments have introduced the CTP (computer-to-plate) method of creating the black mask for the photosensitive resin. In this method, a thin (generally 1-5 μm in thickness) light absorption black layer is formed on the surface of the photosensitive resin plate and the resultant plate is irradiated imagewise with an infrared laser to ablate portions of the mask on the resin plate directly without separately preparing the mask. In such systems, only the mask is ablated without ablating the photosensitive plate precursor. Subsequently, the resultant plate is imagewise exposed to light through the ablated areas of the mask, to crosslink (or harden) the exposed portions of the photosensitive resin, followed by developing treatment in which the unexposed portions (uncrosslinked) of the resin and the remaining black mask layer are washed away with a developing liquid. Both these methods involve developing treatment that requires the use of large quantities of liquids and solvents that subsequently need to be disposed of. In addition, the efficiency in producing plates is limited by the additional drying time of the developed plates that is required to remove the developing liquid and dry the plate.

U.S. Pat. No. 5,719,009 (Fan) describes elements having an ablatable layer disposed over photosensitive layer(s) so that after image ablation, UV exposure of the underlying layer hardens it while non-exposed layer(s) and the ablatable mask layer are subsequently washed away.

DuPont's Cyrel® FAST™ thermal mass transfer plates are commercially available photosensitive resin plate precursors that comprise an integrated ablatable mask element and require minimal chemical processing, but they do require thermal wicking or wiping to remove the non-exposed areas. These also require extensive disposal of liquid polymeric waste and some drying of the processed (developed) plates.

There remains a need for a totally processless method of producing flexographic printing plates with high throughput efficiency. A method for forming a relief pattern on a printing element by directly engraving (DE) with a laser is already used to produce relief plates and stamps. However, the requirement of relief depths in excess of 500 μm challenges the speed at which these flexographic printing plate precursors can be imaged. In contrast to the laser ablation of the CTP mask layers atop the photosensitive resin, which only requires low energy lasers and low fluence, the DE of laser ablatable flexographic printing plates requires higher energy lasers and higher fluence. In addition, the laser ablatable, relief-forming layer becomes the printing surface and must have the appropriate physical and chemical properties needed for good printing. The laser engraveable black mask layer is washed away during the development and is not used during the printing.

Flexographic printing plate precursors used for infrared radiation (IR) laser ablation engraving must comprise an elastomeric or polymeric composition that includes one or more infrared radiation absorbing compounds. When the term "imaging" is used in connection with "laser engraving", it refers to ablation of the background areas while leaving intact the areas of the element that will be inked and printed in a flexographic printing station or press.

Commercial laser engraving is typically carried out using carbon dioxide lasers. While they are generally slow and expensive to use and have poor beam resolution, they are used because of the attractions of direct thermal imaging. Infrared (IR) fiber lasers are also used. These lasers provide better beam resolution, but are very expensive. However, it would be preferable to use infrared (IR) diodes for infrared radiation engraving that have the advantages of high resolution and relatively lower cost so that they can be used in large arrays. In any case, it would be preferable to use higher power laser that approach deposing the energy adiabatically. IR laser engraveable flexographic printing plate blanks having unique engraveable compositions are described in WO 2005/084959 (Figov).

Direct laser engraving is described, for example, in U.S. Pat. Nos. 5,798,202 and 5,804,353 (both Cushner et al.) in which various means are used to reinforce the elastomeric layers. The reinforcement can be done by addition of particulates, by photochemical reinforcement, or by thermochemical hardening. U.S. Pat. No. 5,804,353 describes a multilayer flexographic printing plate wherein the composition of the top layer is different from the composition of the intermediate layer. Carbon black can be used as a reinforcing agent and can be present in both layers. There is no description how this component can impact the engraving process and resulting flexographic printing plate and there is no specific connection contemplated between this and laser ablation efficiency. This patent provides no guidance as to the relative levels of carbon black in each of the layers relative to other layers.

There are a number of elastomeric systems that have been considered for construction of laser engraveable flexographic printing plates. There are many systems that include various IR absorbing particles. However, these systems suffer from poor engraving efficiency when it is desired to ablate several hundred microns into the element and no guidance is provided as to the optimal loading of IR absorbers with respect to the amount of resin or to the effect of concentration of the IR absorber on laser engraving efficiency. When a low concentration of IR absorbing compounds is incorporated into the element, there is either not enough absorption of energy to cause ablation, or there is excessive liquefaction of the element with little ejection of material. Even when ejection occurs, the presence of excess liquefaction, or viscous unejected material can be difficult to remove from the ablated plate. This can also cause problems such as imprecise edges of the imaged features of the relief pattern and the adherence of molten polymer to the surfaces and/or sides of the relief pattern. This ultimately will interfere with image feature quality and printing quality. Further, when large amounts of liquid or viscous material are generated during the laser ablation and are ejected, this debris can stain the optical parts of the laser engraving apparatus, such as the lens, and causes problems with the apparatus. When a high loading of IR absorbing compound is used, there is a decrease in the laser penetration depth due to the Beer-Lambert law of absorbance, and poor ablation efficiency. Another disadvantage to high incorporation of the IR absorbing compounds is that many such compounds, including carbon black, also absorb in the UV region and thus would block any UV radiation that could be used to photochemically crosslink or cure the element composition. There remains a need for laser ablatable compositions that provide increased engraving efficiency so as to increase plate imaging speed and throughput.

SUMMARY OF THE INVENTION

The present invention provides a laser-ablatable element for direct laser engraving comprising at least one laser-ablatable, relief-forming layer that has a relief-image forming surface and a bottom surface, the relief-forming layer comprising a laser-ablatable polymeric binder and an infrared radiation absorbing compound that is present at a concentration profile such that its concentration is greater near the bottom surface than the image-forming surface.

This invention also provides a laser-ablatable element for direct laser engraving comprising at least two laser-ablatable layers including a relief-forming layer and a bottom layer, the relief-forming layer comprising at least two and up to N laser-ablatable sub-layers having thickness $t_1$ $t_2$, . . . $t_N$, respectively, wherein the concentration of infrared radiation absorbing compound within each sub-layer is constant but differs in each laser-ablatable sub-layer such that the absorption coefficient profile corresponding to the infrared radiation absorbing compound concentration is governed substantially in accordance with the function as defined by the Discrete Absorption Concentration (DAC) profile algorithm. The term "Discrete Absorption Concentration (DAC) profile" is described in more detail below.

In addition, a method of providing a relief image comprises imagewise exposing the laser-ablatable element of this invention to infrared radiation provided by at least one laser having a minimum output fluence of 1 J/cm$^2$ at the element surface.

Further, another embodiment of this invention is a method of preparing the laser-ablatable element of this invention comprising forming a laser-ablatable, relief image-forming layer with an image-forming surface and a bottom surface, by applying a formulation comprising a coating solvent, a laser-ablatable polymeric binder, and an infrared radiation absorbing compound, in such a manner that the infrared radiation absorbing compound is present at a concentration profile such that its concentration is greater near the bottom surface than the image-forming surface after the coating solvent is removed.

In still another embodiments, a method of preparing a laser-ablatable element comprises applying to a substrate, multiple formulations each comprising a coating solvent, a laser-ablatable polymeric binder, and an infrared radiation absorbing compound, to provide multiple sub-layers on the substrate, such that the infrared radiation absorbing compound concentration is different in each adjacent pair of sub-layers so that the concentration is always greater in each pair sub-layer that is closer to the substrate, and the concentration is progressively greater in the sub-layers as they are closer to the substrate after the coating solvent is removed.

Further, a method of preparing a laser-ablatable element comprises sequentially injecting or pouring a series of formulations to provide successive sub-layers to form a laser-ablatable, relief image-forming layer having a bottom surface and a relief image-forming surface, wherein each formulation comprises a polymeric binder and an infrared absorbing compound, wherein the concentration of the infrared absorbing compound differs in each formulation so as to provide different concentrations in successive sub-layers and the concentration of the infrared radiation absorbing compound is greater in any sub-layer that is closer to the bottom surface than the concentration in the adjacent sub-layer that is closer to the relief image-forming surface.

The present invention provides a number of advantages. The infrared radiation absorbing compound is distributed in the laser-ablatable relief-forming layer in a profile so that the compound concentration is greater at the bottom of the layer away from the imaging side. Thus, the concentration of the infrared radiation absorbing compound is lower at the top or imaging surface of the laser-ablatable, relief-forming layer. Applicants have discovered that this profile or arrangement of IR radiation absorbing compound concentration provides improved ablation efficiency as the ablated depth obtained in the laser-ablatable, relief-forming layer increases without excessive liquefaction of the laser ablatable materials in the layer.

This invention is particularly advantageous for providing optimal ablation efficiency without excessive liquefaction of the materials when imagewise exposure is carried out using pulsing lasers, that is, when the exposure energy is applied in a substantially adiabatic manner.

One purpose of the present invention is to provide a laser-ablatable relief-forming layer wherein the layer materials are heated by the imaging laser(s) to at least exactly the critical ablation temperature, $T_c$, corresponding to the threshold for ablative ejection, at each depth point through the entire thickness of the layer from the upper laser exposed surface to the bottom surface of the layer.

A laser-ablatable, relief-forming layer is defined as having two main parallel surfaces, wherein the image-forming surface is that which is closer to the incident laser beam(s) and the bottom surface is that which is the farthest from the incident laser beam(s) during the laser ablation imaging process. In a flexographic printing plate, the image-forming surface will be the surface that takes ink from the anilox cylinder and then comes in contact with the printable surface to create a printed image. It is the printing surface. In practice, the bottom surface will be the surface of the laser-ablatable, relief-forming layer that is closest to the support, substrate, or cylinder. It is understood that this layer may in practice be comprised of a single layer, or of a layered structure of multiple thin layers. Other layers, including rubber layers, may be present between the laser-ablatable, relief-forming layer and the support or substrate. Other layers, such as soft elastomeric or rubber layers or anti-curl layers, may be present on the non-imaging side of the support or substrate, which is the side opposite the laser-ablatable, relief-forming layer.

DETAILED DESCRIPTION OF THE INVENTION

Figure 1:
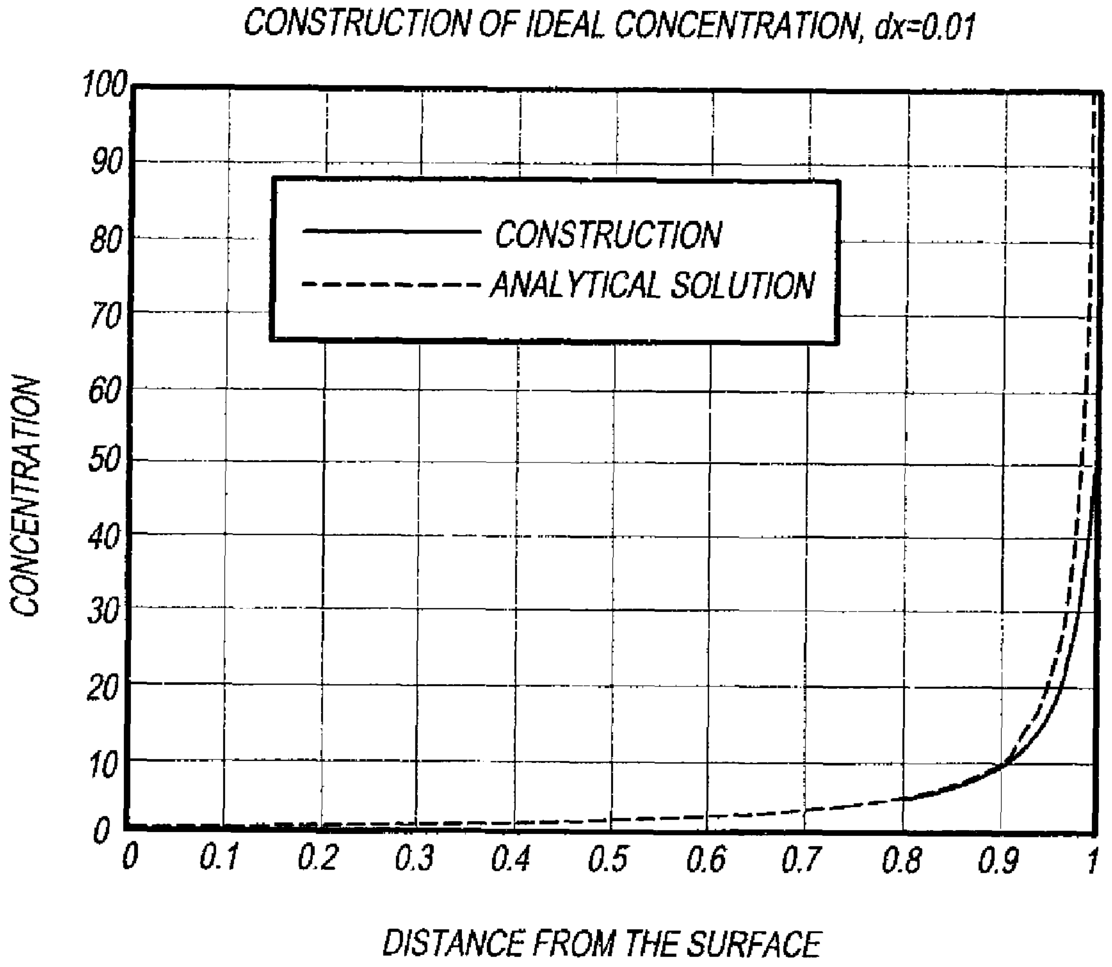
FIG. 1 is graphical plot of infrared radiation absorbing compound concentration versus distance from the image-forming surface for a laser-ablatable relief-forming layer that follows the Beer-Lambert relationship for $\Delta x=0.01$.

To increase the ablation efficiency and to decrease unwanted decompositions and liquefaction (turning to a liquid) one must look at how the energy is deposited in a material. Once that is known the absorption species (absorbers) can be incorporated to deposit the energy where it is best used.

Fundamentally, the laser light intensity absorbed by a material being ablated is governed by the Beer-Lambert relation shown in Equation (1):

$$I(x)=I_0e^{-\alpha x} \tag{1}$$

wherein, $\alpha$ is the absorption coefficient, x is the distance in the thickness direction from the laser exposed surface of the material, and $I_0$ is the laser intensity at that surface. The absorption coefficient $\alpha$ is assumed to be a linear function of the concentration of the laser energy absorbing species, such as carbon black In the adiabatic limit, the temperature reached by the material that is exposed to the laser radiation will be directly proportional to the laser light intensity, and therefore will follow I(x).

A temperature rise $\Delta T$ in the material is related to the energy density e(x) absorbed during one pulse shown in Equation (2):

$$\rho C_P \Delta T=e(x) \tag{2}$$

wherein $\rho$, $C_p$ are the material density and heat capacity of the material, respectively.

The laser intensity (power per unit area) can be related to the fluence F (energy per unit area), and the laser pulse duration time, $\tau$, as defined by Equation (3):

$$I_0=\frac{F}{\tau}. \tag{3}$$

In a material where the concentration of the infrared radiation absorbing compound is constant throughout the thickness of the laser-ablatable, relief-forming layer, the laser light intensity and temperature decrease with depth of penetration through the thickness of the layer, being lowest at the bottom surface, according to Equation (1) noted above.

If the absorption of energy follows the Beer-Lambert relationship, the energy density e(x) absorbed during one pulse is given by Equation (4):

$$e(x)=F\alpha e^{-\alpha x} \tag{4}$$

wherein $\alpha$ is a constant with the uniform distribution of infrared radiation absorbing compound throughout the laser-ablatable polymeric binder.

After one pulse of the laser the temperature is determined by Equation (5):

$$T(x)=T_0+\frac{F\alpha e^{-\alpha x}}{\rho C_p} \tag{5}$$

wherein $T_0$ is the initial temperature of the laser-ablatable, relief-forming layer. This will result in the highest temperature being reached at the image-forming surface and being reduced as the laser intensity decreases with penetration depth, generating an exponential heat profile during an effectively instantaneous exposure pulse, where for any given instant, any unit volume of the layer that is closer in relation to the image-forming surface will be over-heated and any unit volume of the layer that is closer in relation to the bottom surface will be under-heated. This effect leads to an inefficient laser ablation process where energy is wasted. In addition, the portion of the layer that is under-heated (and does not reach the critical ablation temperature, $T_c$) can undergo melting, depolymerization, or other non-ablative changes as a result of the high temperatures, that may create an oily residue and feature distortion in the resulting printed images.

For a layer with infrared radiation absorbing compound present in a concentration profile, according to the present invention, and wherein the Beer-Lambert relationship is followed, the following is believed to be true:

We discovered that to solve the noted problem, what is needed is to heat the laser-ablatable, relief-forming layer to exactly the same critical temperature with no variation with layer depth. We discovered that it would be beneficial to maximize the ablation depth while keeping the same laser fluence, and we discovered that we could achieve this by choosing a profile for the absorption coefficient, where the absorption coefficient is no longer a constant but a function of depth into the laser-ablatable layer, $\alpha(x)$.

The temperature increment due to a pulse of the laser is then modified in the layer according to Equation (6):

$$T(x)=T_0(x)+\frac{\alpha(x)Fe^{-\int_0^x \alpha(x')dx'}}{\rho C_p} \tag{6}$$

wherein the variation of the absorption coefficient with x must be specified.

If the absorption coefficient is chosen as shown in Equation (7):

$$\alpha(x)=\frac{1}{\beta-x} \text{ wherein } \beta\le\frac{F}{\rho C_p(T_c-T_0)}, \tag{7}$$

the temperature rise is:

$$T(x) = T_0 + \frac{F}{\beta \rho C_p}, \tag{8}$$

that is independent of the layer depth and is greater than the critical ablation temperature $T_c$.

The concentration of the infrared radiation absorbing compound, C(x) is related to the absorption coefficient according to Equation (10):

$$\alpha(x) = \epsilon C(x) \tag{10}$$

wherein $\epsilon$ is the molar absorptivity.

For a laser-ablatable, relief-forming layer having the concentration of infrared radiation absorbing compound present in a profile, and wherein the Beer-Lambert relationship is not necessarily followed (as a result of light scattering in the laser-ablatable layer due to large particles), the required concentration profile of the infrared radiation absorbing compound can be constructed to give a constant energy absorption with changing layer depth and to maximize the ablation depth for a given fluence.

The construction of such a concentration profile can be achieved in the following manner:

In this instance, we assume the following quantities are given: critical ablation temperature, $T_c$, power per unit area, $I_0$, pulse duration time $\tau$, absorption coefficient $\alpha$, and the light absorption profiles, $I = F(I_0, \alpha, x)$, are measured for a range of values of power per unit area $I_0$, and a range of values for the IR radiation absorption coefficient $\alpha$.

In this instance, $I_0$ is the power per unit area and the fluence $F = I_0 \times \tau$, energy per unit area is given. The maximum depth of ablation $$\text{is } \frac{F}{\rho C_p (T_c - T_0)}.$$

Mathematically we want to find a absorption coefficient function, f(x), depending on the depth that $$\left| \frac{dF(I_0, f(x), x)}{dx} \right| \times \tau = \rho C_p (T_c - T_0).$$

Constant Absorption Concentration (CAC) Profile Algorithm:

Step 0: Divide the depth into small layers with thickness $\Delta x$ so that $x_1 = 0$ at the surface and set i=1.

Step 1: Find a absorption coefficient $\alpha$, such that $$\left| \frac{dF(I_0, f(x), x)}{dx} \right|_{x=0} = \frac{\rho C_p (T_c - T_0)}{\tau} \text{ and set } f(x_i) = \alpha.$$

Step 2: Update the light power $$I_0 = I_0 - \left| \frac{dF(I_0, f(x), x)}{dx} \right|_{x=0} \times \Delta x$$

Set i=i+1 and $x_{i+1} = x_i + \Delta x$.

Step 3: Repeat Steps 1 and 2 until $I_0 \leqq 0$.

The generated absorption coefficients $\alpha$ for each depth can now be converted to a concentration of absorbers for each depth $x_i$.

The algorithm can be explained as follows:

The slope of light absorption profiles multiplied by the pulsing time is the energy density. For a given laser power per unit area, one can find the concentration of infrared radiation absorbing compound so that the slope of light absorption profile multiplied by the pulsing time just equals the energy density needed to raise the temperature of the laser-ablatable layer from room temperature to the critical ablation temperature $T_c$.

As the layer depth is advanced a tiny degree, the light power at the new depth is decreased by the slope multiplied by the change in depth. Since the laser power is lower at this new depth, one then needs to find a new concentration of infrared radiation absorbing compound (probably higher) such that the slope of the light absorption profile multiplied by the pulsing time is just equal to the required energy density.

This step is repeated until the light power zero.

Figure 2:
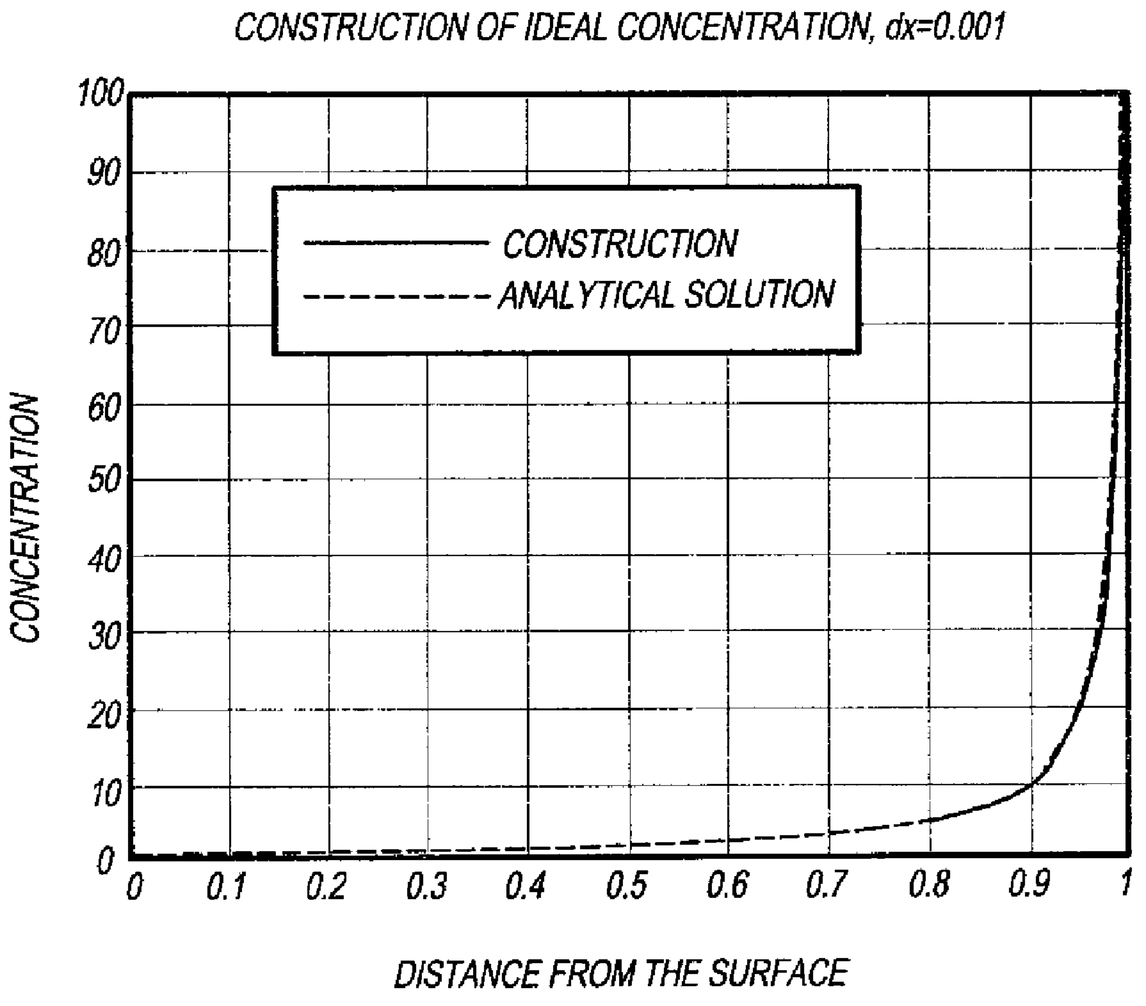
FIG. 2 is graphical plot of infrared radiation absorbing compound concentration versus distance from the image-forming surface for a laser-ablatable relief-forming layer that follows the Beer-Lambert relationship for $\Delta x=0.001$.
Figure 3:
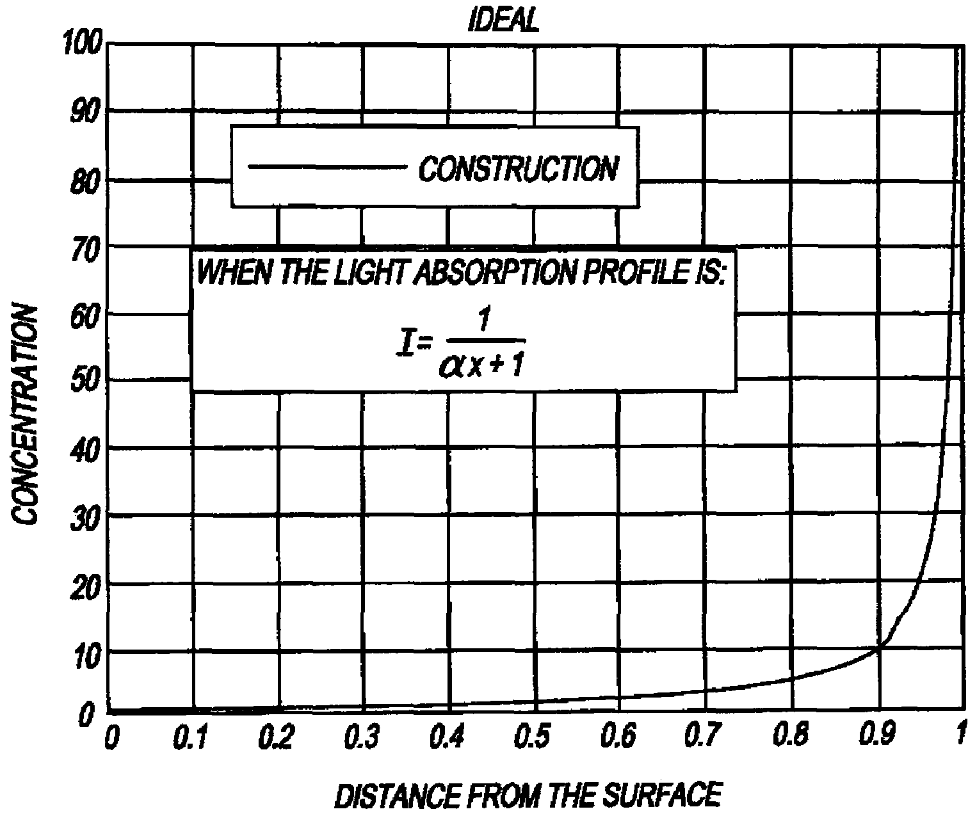
FIG. 3 is graphical plot of infrared radiation absorbing compound concentration versus distance from the image-forming surface for a laser-ablatable relief-forming layer that does not follow the Beer-Lambert relationship.

FIGS. 1 and 2 show the results of the construction of an infrared radiation absorbing compound concentration profile when the Beer-Lambert relationship is followed. FIG. 3 shows the results of the construction of an infrared radiation absorption profile in which the Beer-Lambert relationship is not followed.

In most cases, the absorption follows the Bears-Lambert law and multiple layers are applied discretely. It is therefore desirable to have an algorithm for this special simpler case. In this case, we would design the concentration profile for the infrared radiation absorbing compound in each sub-layer to maximize the ablation depth.

Suppose there are layers of thickness $t_1, t_2, t_3, \ldots t_N$, the algorithm to be used is as follows:

Discrete Absorption Concentration (DAC) Profile Algorithm:

Set $F_1 = F_0$ and i=1.

Step 1: Find $\alpha_i$ such that $$T_0 + \frac{F_i \alpha_i \exp(-\alpha_i t_i)}{\rho C_p} = T_c.$$

When $$\frac{(T_c - T_0)\rho C_p t_i}{F_i} \geq \exp(-1)$$

there is no solution. Stop.

Step 2: Update $F_{i+1} = F_i \exp(-\alpha_i t_i)$.

Set i=i+1.

Go back to Step 1.

This generates $\alpha_i$ for each layer i that can then be converted to a concentration based on the extinction coefficient of the absorber and the thickness of the layer.

Figure 4:
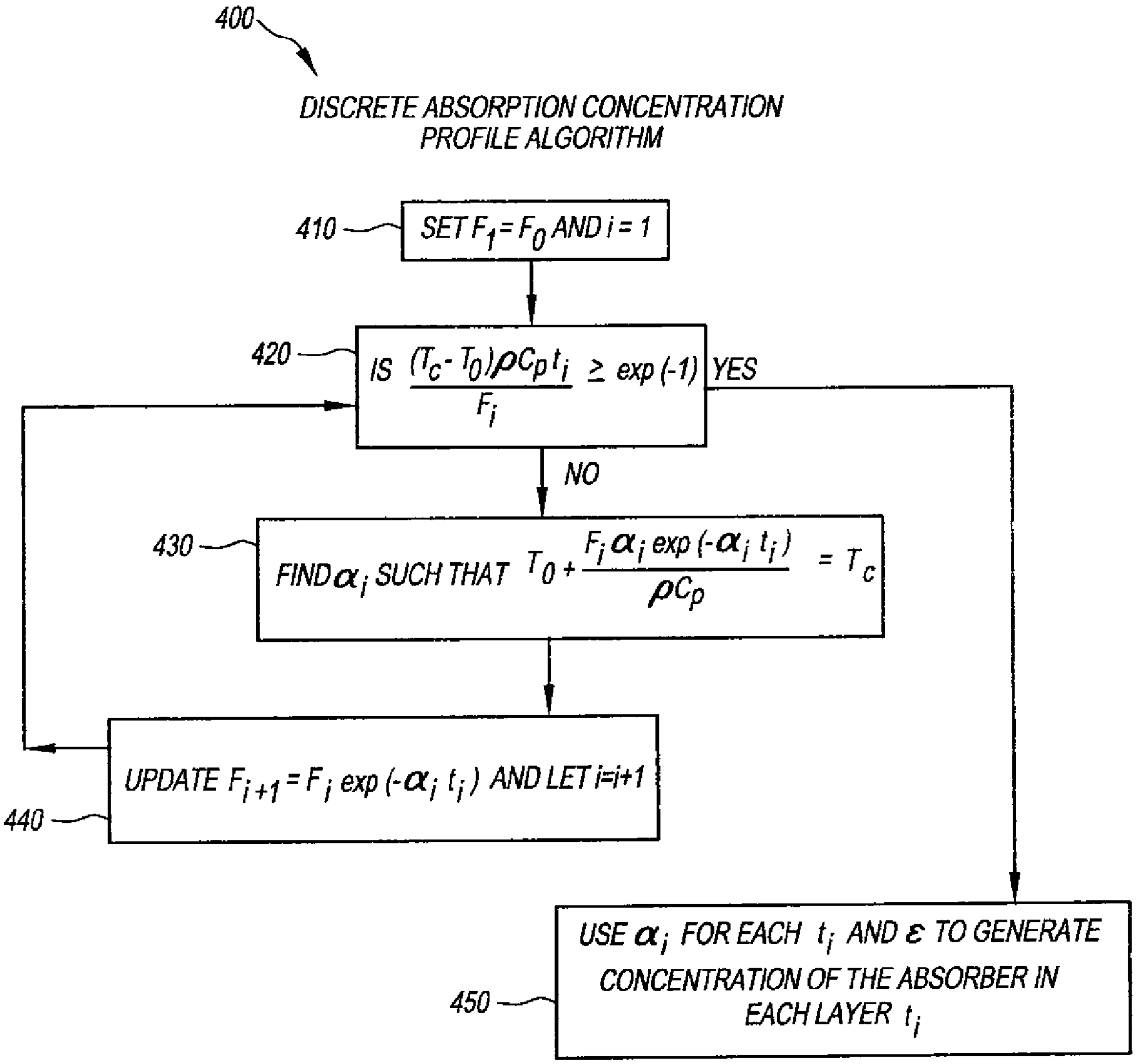
FIG. 4 is a flow chart showing the steps involved in generating a Discrete Absorption Concentration (DAC) profile.

Referring to FIG. 4, we exemplify the algorithm 400 in a flow chart with the title Discrete Absorption Concentration Profile algorithm. In step one 410, we set the fluence for the first layer to the initial fluence $F_0$ and set the layer counter I to 1 to initialize. In step two 420, we check to see if there is not enough energy to heat the layer to the critical temperature. If there is a "No" result, there is enough energy to fully heat the layer. We move to step three 430, we calculate what $\alpha_i$ is needed to only take the amount to reach the critical temperature for that layer. In step four 440, we update the fluence entering the next layer and increment the layer pointer. We then return to step two 420 until all the energy in the beam or all the layers are exhausted. This results in a "Yes" and so now we can gather the $\alpha_i$ for each layer and covert them to a concentration via the absorber's extinction coefficient, step 450.

DEFINITIONS

The term "laser-ablatable element" used herein includes any imageable element or material of any form in which a relief image can be produced using a laser according to the present invention. In most instances, however, the laser-ablatable elements are used to form flexographic printing plates (flat sheets) or flexographic printing sleeves with a relief image having a relief depth of at least 100 μm. Such laser-ablatable, relief-forming elements may also be known as "flexographic printing plate blanks", flexographic printing plate precursors, "flexographic sleeve blanks", or flexographic printing sleeve precursors. The laser-ablatable elements can also be in the form of seamless continuous forms.

Unless otherwise indicated, when the term "laser-ablatable element" is used, it is in reference to an embodiment of this invention.

By "ablative", we mean that the imageable (or laser-ablatable relief-forming) layer can be imaged using an infrared radiation source (such as a laser) that produces heat within the layer that causes rapid local changes in the laser-ablatable, relief-forming layer so that the imaged regions are physically detached from the rest of the layer or substrate and ejected from the layer and collected by a vacuum system. Non-imaged regions of the laser-ablatable relief-forming layer are not removed or volatilized to an appreciable extent and thus form the upper surface of the relief image that is the printing surface. The breakdown is a violent process that includes eruptions, explosions, tearing, decomposition, fragmentation, or other destructive processes that create a broad collection of materials. This is distinguishable from, for example, image transfer. "Ablation imaging" is also known as "ablation engraving" in this art. It is also distinguishable from image transfer methods in which ablation is used to materially transfer an image by transferring pigments, colorants, or other image-forming components.

Unless otherwise indicated, the term "weight %" refers to the amount of a component or material based on the total dry layer weight of the composition or layer in which it is located.

The "top surface" is equivalent to the "relief-image forming surface" and is defined as the outermost surface of the laser-ablatable relief-forming layer and is the first surface of that layer that is struck by imaging infrared radiation during the engraving process. The "bottom surface" is defined as the surface of the laser-ablatable relief-forming layer that is most distant from the imaging infrared radiation.

The term "adiabatically" means operating in the adiabatic regime. The term "adiabatic regime" refers to a timescale such that heat does not flow out of the beam substantially during the impingement. The laser may be pulsed or continuous. If continuous, the laser must either be modulated rapidly or have relative movement with the media such that the impinging spot have changed on a short time scale compared to the heat flow from the beam absorption area.

The term "gradient" can be used to define a concentration profile of the infrared radiation absorbing compound through the thickness of the laser-ablatable, relief-forming layer from the top surface to the bottom surface. The term "inverse gradient" is used to describe a concentration profile of the infrared radiation absorbing compound that is taken in the thickness direction from the bottom surface to the top surface.

Laser-Ablatable Element

The laser-ablatable elements can include a self-supporting laser-ablatable, relief-forming layer (defined below) that does not need a separate substrate to have physical integrity and strength. In such embodiments, the laser-ablatable, relief-forming layer is thick enough and laser ablation is controlled in such a manner that the relief image depth is less than the entire thickness, for example at least 20% but less than 80% of the entire thickness.

However, in other embodiments, the laser-ablatable elements include a suitable dimensionally stable, non-laser ablatable substrate having an imaging side and a non-imaging side. The substrate has at least one laser ablatable, relief-forming layer disposed on the imaging side. Suitable substrates include dimensionally stable polymeric films, aluminum sheets or cylinders, transparent foams, ceramics, fabrics, or laminates of polymeric films (from condensation or addition polymers) and metal sheets such as a laminate of a polyester and aluminum sheet or polyester/polyamide laminates, or a laminate of a polyester film and a compliant or adhesive support. Polyester, polycarbonate, polyvinyl, and polystyrene films are typically used. Useful polyesters include but are not limited to poly(ethylene terephthalate) and poly(ethylene naphthalate). The substrates can have any suitable thickness, but generally they are at least 0.01 mm or from about 0.05 to about 0.3 mm thick, especially for the polymeric substrates. An adhesive layer may be used to secure the laser-ablatable layer to the substrate.

There may be a non-laser ablatable backcoat on the non-imaging side of the substrate (if present) that may be composed of a soft rubber or foam, or other compliant layer. This backcoat may be present to provide adhesion between the substrate and the printing press rollers and to provide extra compliance to the resulting printing plate, or to reduce or control the curl of the printing plate.

The laser-ablatable element contains one or more layers. That is, it can contain multiple layers, at least one of which is a laser-ablatable, relief-forming layer. For example, there may be a non-laser ablatable elastomeric rubber layer (for example, a cushioning layer) between the substrate and the laser-ablatable relief-forming layer.

In most embodiments, the laser-ablatable, relief-forming layer is the outermost layer, including embodiments where the laser-ablatable, relief-forming layer is disposed on a printing cylinder. However, in some embodiments, the laser-ablatable, relief-forming layer can be located underneath an outermost capping smoothing layer that provides additional smoothness or better ink reception and release. This layer can have a general thickness of from about 1 to about 200 μm.

In general, the laser-ablatable, relief-forming layer has a thickness of at least 50 μm and generally from about 50 to about 4,000 μm, and typically from 200 to 2,000 μm.

The laser-ablatable, relief-forming layer includes one or more laser-ablatable polymeric binders such as crosslinked elastomeric or rubbery resins. These resins are usually film-forming in nature. For example, the elastomeric resins can be thermosetting or thermoplastic urethane resins and derived from the reaction of a polyol (such as polymeric diol or triol) with a polyisocyanate, or the reaction of a polyamine with a polyisocyanate. In other embodiments, the polymeric binder consists of a thermoplastic elastomer and a thermally initiated reaction product of a multifunctional monomer or oligomer.

Other elastomeric resins include copolymers or styrene and butadiene, copolymers of isoprene and styrene, styrene-butadiene-styrene block copolymers, styrene-isoprene-styrene copolymers, other polybutadiene or polyisoprene elastomers, nitrile elastomers, polychloroprene, polyisobutylene and other butyl elastomers, any elastomers containing chlorosulfonated polyethylene, polysulfide, polyalkylene oxides, or polyphosphazenes, elastomeric polymers of (meth)acrylates, elastomeric polyesters, and other similar polymers known in the art.

Other useful laser-ablatable resins include vulcanized rubbers, such as EPDM (ethylene-propylene diene rubber), Nitrile (Buna-N), Natural rubber, Neoprene or chloroprene rubber, silicone rubber, fluorocarbon rubber, fluorosilicone rubber, SBR (styrene-butadiene rubber), NBR (acrylonitrile-butadiene rubber), ethylene-propylene rubber, and butyl rubber.

Still other useful laser-ablatable resins are polymeric materials that, upon heating to 300° C. (generally under nitrogen) at a rate of 10° C./minute, lose at least 60% (typically at least 90%) of their mass and form identifiable low molecular weight products that usually have a molecular weight of 200 or less. Specific examples of such laser ablatable materials include but are not limited to, poly(cyanoacrylate)s that include recurring units derived from at least one alkyl-2-cyanoacrylate monomer and that forms such monomer as the predominant low molecular weight product during ablation. These polymers can be homopolymers of a single cyanoacrylate monomer or copolymers derived from one or more different cyanoacrylate monomers, and optionally other ethylenically unsaturated polymerizable monomers such as (meth) acrylate, (meth)acrylamides, vinyl ethers, butadienes, (meth) acrylic acid, vinyl pyridine, vinyl phosphonic acid, vinyl sulfonic acid, and styrene and styrene derivatives (such as α-methylstyrene), as long as the non-cyanoacrylate comonomers do not inhibit the ablation process. The monomers used to provide these polymers can be alkyl cyanoacrylates, alkoxy cyanoacrylates, and alkoxyalkyl cyanoacrylates. Representative examples of poly(cyanoacrylates) include but are not limited to poly(alkyl cyanoacrylates) and poly(alkoxyalkyl cyanoacrylates) such as poly(methyl-2-cyanoacrylate), poly (ethyl-2-cyanoacrylate), poly(methoxyethyl-2-cyanoacrylate), poly(ethoxyethyl-2-cyanoacrylate), poly(methyl-2-cyanoacrylate-co-ethyl-2-cyanoacrylate), and other polymers described in U.S. Pat. No. 5,998,088 (Robello et al.)

In other embodiments, the laser-ablatable polymeric binder is an alkyl-substituted polycarbonate or polycarbonate block copolymer that forms a cyclic alkylene carbonate as the predominant low molecular weight product during depolymerization from ablation. The polycarbonate can be amorphous or crystalline, and can be obtained from a number of commercial sources including Aldrich Chemical Company (Milwaukee, Wis.). Representative polycarbonates are described for example in U.S. Pat. No. 5,156,938 (Foley et al.), Cols. 9-12 of which are incorporated herein by reference. These polymers can be obtained from various commercial sources or prepared using known synthetic methods.

In still other embodiments, the laser-ablatable polymeric binder is a polycarbonate (tBOC type) that forms a diol and diene as the predominant low molecular weight products from depolymerization during ablation.

Yet other embodiments include laser-ablatable polymeric binders that are polyesters that are "depolymerized" to form secondary alcohols as the predominant low molecular weight products.

The laser-ablatable polymeric binders generally comprise at least 10 weight % and up to 99 weight %, and typically from about 30 to about 80 weight %, of the laser-ablatable relief-forming layer.

The laser-ablatable, relief-forming layer can also include one or more laser-ablatable materials that are dispersed within a film-forming polymeric binder. Thus, in some instances, the film-forming polymeric binders are themselves "laser-ablatable", but in other instances, the laser-ablatable materials are dispersed within one or more non-ablatable or laser-ablatable film-forming polymeric binders.

In some embodiments, microcapsules are dispersed within laser-ablatable polymeric binders. For example, laser-ablatable microcapsules can be dispersed within film-forming polymers or polymeric binders described above.

The "microcapsules" can also be known as "hollow beads", "microspheres", microbubbles", "micro-balloons", "porous beads", or "porous particles". Such components generally include a thermoplastic polymeric outer shell and either core of air or a volatile liquid such as isopentane and isobutane. These microcapsules include a single center core or many voids within the core. The voids can be interconnected or non-connected.

For example, non-laser-ablatable microcapsules can be designed like those described in U.S. Pat. Nos. 4,060,032 (Evans) and 6,989,220 (Kanga) in which the shell is composed of a poly[vinylidene-(meth)acrylonitrile] resin or poly (vinylidene chloride), or as plastic micro-balloons as described for example in U.S. Pat. Nos. 6,090,529 (Gelbart) and 6,159,659 (Gelbart).

Laser-ablatable microcapsules can be similarly designed but the shell is composed a laser-ablatable material.

The microspheres should be stable during the manufacturing process of the laser-ablatable element, such as under extrusion conditions. Yet, in some embodiments, the microspheres are able to collapse under imaging conditions. Both unexpanded microspheres and expanded microspheres can be used in this invention. The amount of microspheres that may be present is from about 2 to about 70 weight % of the laser-ablatable, relief-forming layer. Generally, the microspheres comprise a thermoplastic shell that is either hollow inside or enclosing a hydrocarbon or low boiling liquid. For example, the shell can be composed of a copolymer of acrylonitrile and vinylidene chloride or methacrylonitrile, methyl methacrylate, or a copolymer of vinylidene chloride, methacrylic acid, and acrylonitrile. If a hydrocarbon is present within the microspheres, it can be isobutene or isopentane. EXPANCEL® microspheres are commercially available from Akzo Noble Industries (Duluth, Ga.). Dualite and Micropearl polymeric microspheres are commercially available from Pierce & Stevens Corporation (Buffalo, N.Y.). Hollow plastic pigments are available from Dow Chemical Company (Midland, Mich.) and Rohm and Haas (Philadelphia, Pa.).

The laser-ablatable, relief-forming layer also includes one or more infrared radiation absorbing compounds that absorb IR radiation in the range of from about 750 to about 1400 nm or typically from 750 to 1250 nm, and transfer the exposing photons into thermal energy. Particularly useful infrared radiation absorbing compounds are responsive to exposure from IR lasers. Mixtures of the same or different type of infrared radiation absorbing compound can be used if desired.

A wide range of infrared radiation absorbing compounds are useful in the present invention, including carbon blacks and other IR-absorbing organic or inorganic pigments (including squarylium, cyanine, merocyanine, indolizine, pyrylium, metal phthalocyanines, and metal dithiolene pigments), and metal oxides. Examples include RAVEN 450, 760 ULTRA, 890, 1020, 1250 and others that are available from Columbian Chemicals Co. (Atlanta, Ga.) as well as BLACK PEARLS 170, BLACK PEARLS 480, VULCAN XC72, BLACK PEARLS 1100.

Also useful IR radiation absorbing compounds include carbon blacks that are surface-functionalized with solubilizing groups are well known in the art. Carbon blacks that are grafted to hydrophilic, nonionic polymers, such as FX-GE-003 (manufactured by Nippon Shokubai), or which are surface-functionalized with anionic groups, such as CAB-O-JET® 200 or CAB-O-JET® 300 (manufactured by the Cabot Corporation) are also useful. Other useful carbon blacks are Mogul L, Mogul E, Emperor 2000, Vulcan XC-72 and Regal 330, and 400, all from Cabot Corporation (Boston Mass.). Other useful pigments include, but are not limited to, Heliogen Green, Nigrosine Base, iron (III) oxides, transparent iron oxides, magnetic pigments, manganese oxide, Prussian Blue, and Paris Blue. Other useful IR radiation absorbing compounds are carbon nanotubes, such as single- and multi-walled carbon nanotubes, graphite, grapheme, and porous graphite.

Although the size of the IR absorbing pigment or carbon black is not critical for the purpose of the invention, it should be recognized that a finer dispersion of very small particles will provide an optimum ablation feature resolution and ablation efficiency. Particularly suitable particles are those with diameters less than 1 μm.

Dispersants and surface functional ligands can be used to improve the quality of the carbon black or metal oxide, or pigment dispersion so that uniform incorporation of the IR radiation absorbing compound throughout the laser-ablatable, relief-forming layer can be achieved.

Other useful infrared radiation absorbing compounds (such as IR dyes) are described in U.S. Pat. Nos. 4,912,083 (Chapman et al.), 4,942,141 (DeBoer et al.), 4,948,776 (Evans et al.), 4,948,777 (Evans et al.), 4,948,778 (DeBoer), 4,950,639 (DeBoer et al.), 4,950,640 (Evans et al.), 4,952,552 (Chapman et al.), 4,973,572 (DeBoer), 5,036,040 (Chapman et al.), and 5,166,024 (Bugner et al.).

The infrared radiation absorbing compound(s) are present in the laser-ablatable, relief-forming layer generally in a total amount of at least 1 weight %, and typically from about 2 to about 20 weight %, based on the total dry weight of the layer.

As noted above, the infrared radiation absorbing compound is not merely dispersed uniformly within the laser-ablatable, relief-forming layer, but it is present in a concentration that is greater near the bottom surface than the image-forming surface. In most embodiments, this concentration profile provides a laser energy absorption profile as the depth into the laser-ablatable, relief-forming layer increases. In some instances, the concentration change is continuously and generally uniformly increasing with depth. In other instances, the concentration is varied with layer depth in a step-wise manner.

For example, the infrared radiation absorbing compound can be present in the laser-ablatable, relief-forming layer in a concentration profile throughout depth x from the relief-image forming surface so that the absorption coefficient α(x) is defined substantially in accordance with the following equation:

$$\alpha(x) = \frac{1}{\beta - x} \text{ wherein } \beta \leq \frac{F}{\rho C_p(T_c - T_0)}$$

wherein F is the fluence (energy per unit area) of infrared radiation at the laser-ablatable, relief-forming layer surface, ρ is the density of the laser-ablatable, relief-forming layer, $C_p$ is the heat capacity of the laser-ablatable, relief-forming layer, $T_0$ is the initial temperature of the laser-ablatable, relief-forming layer, and $T_c$ is critical ablation temperature of this layer.

To use these mathematical equations, the density ρ can be determined by calculating the mass/volume, by a gas pycnometer, or any commercially available apparatus designed to measure density of solids. In addition, $C_p$ can be determined by calorimetric methods such as differential scanning calorimetry. $T_0$ is determined by any temperature measuring device, and $T_c$ is determined by measuring the temperature at which a material vaporizes and can be correlated to the temperature at which 50% weight loss of the material occurs as measured using a thermogravimetric analysis apparatus.

By "substantially in accordance with", we mean that the concentration profile is within ±20% of the theoretical concentration profile defined in FIG. 2.

For example, the laser-ablatable element can be prepared by forming a laser-ablatable, relief image-forming layer with an image-forming surface and a bottom surface, from a formulation comprising a coating solvent, a laser-ablatable polymeric binder, and an infrared radiation absorbing compound, in such a manner that the infrared radiation absorbing compound is present at a concentration profile such that its concentration is greater near the bottom surface than the image-forming surface when the coating solvent is removed. As one skilled in the art would understand, the exact form of the concentration profile of the infrared radiation absorbing compound would be controlled by the coating and drying conditions (for example coating and drying speeds and temperatures), coating machines, and formulation used for making the relief image-forming layer, including but not limited to the types of solvents (for example viscosity and boiling points), specific polymeric binders (for example density, viscosity, and concentration), and specific infrared radiation absorbing compounds (for example density and concentration). Thus, one could control the phase separation throughout the relief image-forming layer to achieve the desired concentration profile.

More specifically, the desired concentration profile can be provided by forming the laser-ablatable, relief-forming layer as a composite of two or more sub-layers having different concentrations of the infrared radiation absorbing compound such that its concentration is progressively greater in the sub-layers closer to the bottom surface than at the image-forming surface.

Thus, the laser-ablatable element can be formed by applying to a substrate, multiple formulations each comprising a coating solvent, a laser-ablatable polymeric binder, and an infrared radiation absorbing compound, to provide multiple sub-layers on the substrate, such that the infrared radiation absorbing compound concentration is different in each adjacent pair of sub-layers so that the concentration is always greater in each pair sub-layer that is closer to the substrate, and the concentration is progressively greater in the sub-layers as they are closer to the substrate when each coating solvent is removed.

The sub-layers can be formed in any suitable fashion, for example by sequentially injecting, spraying, or pouring a series of formulations to provide successive sub-layers to form a laser-ablatable, relief-forming layer having a bottom surface and a relief image-forming surface. Each formulation comprises a polymeric binder and an infrared radiation absorbing compound and the concentration of that compound differs in each formulation so as to provide different concentrations in successive sub-layers and the concentration of the infrared radiation absorbing compound is greater in any sub-layer that is closer to the bottom surface than the concentration in the adjacent sub-layer that is closer to the relief image-forming surface.

In addition, the infrared radiation absorbing compound can be magnetic metal oxide (for example iron oxide) particles and the desired concentration profile can be provided in the laser-ablatable, relief-forming layer by application of a suitable magnetic field during manufacture or preparation of the laser-ablatable element.

Representative procedures for making the sub-layers and forming a laser-ablatable, relief-forming layer are shown below in the Invention Examples.

In order to facilitate ablation to desired relief depth and to provide specific physical properties such as hardness, swell control, and mechanical strength to the element, it may be useful to include inert or "inactive" particulate materials, inert or "inactive" microspheres, a foam or porous matrix, or similar microvoids or inorganic particles in the laser-ablatable, relief-forming layer. For example, as described in U.S. Pat. No. 6,159,659 (Gelbart), inert glass or microspheres may be dispersed within the ablatable film-forming material(s). Other inert materials may be included if they contribute to a better relief image and better printing quality. Such inert materials do not react in any fashion and thus keep their chemical composition, but they provide centers for loosening the laser-ablatable materials upon laser imaging, or alter the physical properties of the laser-ablatable, relief-forming layer in such a way that cleaner ablation edges can be obtained. Particulate additives include solid and porous fillers, which can be organic or inorganic (such as metallic) in composition. Examples of inert solid inorganic particles are silica and alumina, and particles such as fine particulate silica, fumed silica, porous silica, surface treated silica, sold as Aerosil from Degussa and Cab-O-Sil from Cabot Corporation, micropowders such as amorphous magnesium silicate cosmetic microspheres sold by Cabot and 3M Corporation, calcium carbonate and barium sulfate particles and microparticles.

Inert microspheres can be hollow or filled with an inert solvent, and upon laser imaging, they burst and give a foam-like structure or facilitate ablation of material from the laser-ablatable, relief-forming layer because they reduce the energy needed for ablation. Inert microspheres are generally formed of an inert polymeric or inorganic glass material such as a styrene or acrylate copolymer, silicon oxide glass, magnesium silicate glass, vinylidene chloride copolymers.

The amount of inert particulate materials or microspheres that may be present is from about 4 to about 70 weight % of the dry laser-ablatable, relief-forming layer.

Optional addenda in the laser-ablatable, relief-forming layer can include but are not limited to, plasticizers, dyes, fillers, antioxidants, antiozonants, stabilizers, dispersing aids, surfactants, dyes or colorants for color control, and adhesion promoters, as long as they do not interfere with ablation efficiency.

The laser-ablatable element can be prepared in various ways, for example, by coating, or spraying the layer or sub-layer formulations to prepare the laser-ablatable, relief-forming layer out of a suitable solvent and drying. Alternatively, the layer or sub-layer formulations can be press-molded, injection-molded, melt extruded, co-extruded, or melt calendared into an appropriate layer or ring (sleeve) and adhered or laminated to a substrate and cured to form a layer, flat or curved sheet, or seamless printing sleeve. The elements in sheet-form can be wrapped around a printing cylinder and fused at the edges to form a seamless printing element.

The laser-ablatable element may also be constructed with a suitable protective layer or slip film (with release properties or a release agent) in a cover sheet that is removed prior to ablation imaging. Such protective layers can be a polyester film [such as poly(ethylene terephthalate)] to form a cover sheet.

A backing layer on the substrate side opposite the laser-ablatable, relief-forming layer can also be present that may be reflective of infrared imaging radiation or transparent to it.

Laser Ablation Imaging

Ablation energy is generally applied using a suitable imaging laser such as a $CO_2$ or infrared radiation-emitting diode or YAG lasers, or array or such lasers. Ablation to provide a relief image with a minimum depth of at least 50 μm is desired with a relief image having a minimum depth of at least 100 μm or a typical depth of from 300 to 1000 μm or up to 600 μm being desirable. The relief image may have a maximum depth up to about 100% of the original thickness of the laser-ablatable, relief-forming layer when a substrate is present. In such instances, the floor of the relief image may be the substrate (if the laser-ablatable, relief-forming layer is completely removed in the imaged regions), a lower region of the laser-ablatable, relief-forming layer, or an underlayer such as an adhesive layer or compliant layer. When a substrate is absent, the relief image may have a maximum depth of up to 80% of the original thickness of the laser-ablatable, relief-forming layer. An IR diode laser operating at a wavelength of from about 700 to about 1250 nm is generally used, and a diode laser operating at from 800 nm to 1250 nm is useful for ablative imaging. The diode laser must have a high enough intensity that the pulse or the effective pulse caused by relative movement is deposited approximately adiabatic during the pulse.

Generally, ablation imaging is achieved using at least one infrared radiation laser having a minimum fluence level of at least 1 $J/cm^2$ at the element surface and typically infrared imaging is at from about 20 to about 1000 $J/cm^2$ or from 50 to 800 $J/cm^2$.

Ablation to form a relief image can occur in various contexts. For example, sheet-like elements can be imaged and used as desired, or wrapped around a printing cylinder or cylinder form before imaging. The laser-ablatable element can also be a printing sleeve that can be imaged before or after mounting on a printing cylinder.

During imaging, most of the removed products of ablation are gaseous or volatile and readily collected by vacuum for disposal or chemical treatment. Any solid debris can be similarly collected using vacuum or washing.

After imaging, the resulting relief element can be subjected to an optional detacking step if the relief surface is still tacky, using methods known in the art.

During printing, the resulting flexographic printing plate is inked using known methods and the ink is appropriately transferred to a suitable substrate such as paper, plastics, fabrics, paperboard, or cardboard.

After printing, the flexographic printing plate or sleeve can be cleaned and reused and a printing cylinder can be scraped or otherwise cleaned and reused as needed.

The present invention provides at least the following embodiments and combinations thereof:

1. A laser-ablatable element for direct laser engraving comprising at least one laser-ablatable, relief-forming layer that has a relief-image forming surface and a bottom surface, the relief-forming layer comprising a laser-ablatable polymeric binder and an infrared radiation absorbing compound that is present at a concentration profile such that its concentration is greater near the bottom surface than the image-forming surface.

2. The element of embodiment 1 wherein the concentration profile of the infrared radiation absorbing compound provides a constant laser energy absorption profile with depth in the relief-forming layer.

3. The element of embodiment 1 or 2 wherein the infrared radiation-absorbing compound is present in the relief-forming layer in a concentration profile throughout depth x from the relief-image forming surface so that the absorption coefficient profile α(x) is substantially in accordance with the following equation:

$$\alpha(x) = \frac{1}{\beta - x} \text{ wherein } \beta \leq \frac{F}{\rho C_p (T_c - T_0)}$$

wherein F is the fluence (energy per unit area) of the infrared radiation source at the relief-forming layer surface, ρ is the density of the relief-forming layer, $C_p$ is the heat capacity of the relief-forming layer, $T_0$ is the initial temperature of the relief-forming layer, and $T_c$ is critical ablation temperature of the relief-forming layer.

4. The element of any of embodiments 1 to 3 wherein the relief-forming layer has a dry thickness of from about 100 to about 4000 μm.

5. The element of any of embodiments 1 to 4 wherein the relief-forming layer has a dry thickness of from 200 to 2000 μm.

6. The element of any of embodiments 1 to 5 further comprising a non-laser ablatable substrate having an imaging side and a non-imaging side, and having the relief-forming layer disposed on the imaging side.

7. The element of any of embodiments 1 to 6 that is a flexographic printing plate precursor or flexographic printing sleeve precursor.

8. The element of any of embodiments 1 to 7 further comprising a non-laser ablatable substrate and an elastomeric rubber layer between the substrate and the relief-forming layer.

9. The element of any of embodiments 1 to 8 further comprising a non-laser ablatable substrate having an imaging side and a non-imaging side and having at least one non-ablatable layer on the non-imaging side the substrate.

10. The element of any of embodiments 1 to 9 wherein the laser-ablatable polymeric binder is a crosslinked elastomeric or rubbery resin.

11. The element of embodiment 10 wherein the crosslinked elastomer is derived by the reaction of a polyol with a polyisocyanate or the reaction of a polyamine with a polyisocyanate.

12. The element of any of embodiments 1 to 11 wherein the polymeric binder consists of a thermoplastic elastomer and a thermally initiated reaction product of a multifunctional monomer or oligomer.

13. The element of any of embodiments 1 to 12 wherein the infrared radiation absorbing compound is a carbon black, an organic or inorganic pigment, an organic dye that has a $\lambda_{max}$ of from about 800 to about 1200 nm, or any combination of these.

14. The element of any of embodiments 1 to 12 wherein the infrared radiation absorbing compound is a magnetic compound where the concentration profile can be produced by the application of a magnetic field.

15. The element of any of embodiments 1 to 14 wherein the infrared radiation absorbing compound is present in an amount of from about 1 to about 20 weight % based on the dry weight of the relief-forming layer.

16. The element of any of embodiments 1 to 15 wherein the relief-forming layer further comprises micropores, microcapsules, or inorganic particles, or any combination thereof.

17. The element of any of embodiments 1 to 16 wherein the relief-forming layer is composed of two or more sub-layers having different concentrations of the infrared radiation absorbing compound such that its concentration is progressively greater in the sub-layers closer to the bottom surface than at the image-forming surface.

18. A laser-ablatable element for direct laser engraving comprising at least two laser-ablatable layers including a relief-forming layer and a bottom layer, the relief-forming layer comprising at least two and up to N laser-ablatable sub-layers having thickness $t_1, t_2, \ldots t_N$, respectively, wherein the concentration of infrared radiation absorbing compound within each sub-layer is constant but differs in each laser-ablatable sub-layer such that the absorption coefficient profile corresponding to the infrared radiation absorbing compound concentration is governed substantially in accordance with a function as defined by a Discrete Absorption Concentration (DAC) profile algorithm.

19. A method of providing a relief image comprising imagewise exposing the laser-ablatable element of any of embodiments 1 to 18 to infrared radiation provided by at least one laser having a minimum output fluence at the element surface of 1 J/cm$^2$.

20. The method of embodiment 19 for providing a flexographic printing plate, flexographic printing sleeve, or flexographic printing cylinder.

21. The method of embodiment 19 or 20 for providing a relief image having a minimum depth of at least 100 μm.

22. The method of any of embodiments 19 to 21 wherein the imagewise exposure is carried out using a fluence of from about 20 to about 1000 J/cm$^2$.

23. The method of any of embodiments 19 to 22 the imagewise exposure is carried out at a wavelength of from about 800 to about 1200 nm.

24. The method of any of embodiments 19 to 23 for providing a relief image having a depth of from about 100 to about 600 μm.

25. The method of any of embodiments 19 to 24 wherein the laser-ablatable element is imagewise exposed adiabatically.

26. A method of preparing the laser-ablatable element of any of embodiments 1 to 18 comprising forming a laser-ablatable relief image-forming layer with an image-forming surface and a bottom surface, by applying a formulation comprising a coating solvent, a laser-ablatable polymeric binder, and an infrared radiation absorbing compound, in such a manner that the infrared radiation absorbing compound is present at a concentration profile such that its concentration is greater near the bottom surface than the image-forming surface after the coating solvent is removed.

27. A method of preparing a laser-ablatable element comprising applying to a substrate, multiple formulations each comprising a coating solvent, a laser-ablatable polymeric binder, and an infrared radiation absorbing compound, to provide multiple sub-layers on the substrate, such that the infrared radiation absorbing compound concentration is different in each adjacent pair of sub-layers so that the concentration is always greater in each pair sub-layer that is closer to the substrate, and the concentration is progressively greater in the sub-layers as they are closer to the substrate after the coating solvent is removed.

28. A method of preparing a laser-ablatable element comprising sequentially injecting or pouring a series of formulations to provide successive sub-layers to form a laser-ablatable, relief image-forming layer having a bottom surface and a relief image-forming surface, wherein each formulation comprises a polymeric binder and an infrared absorbing compound, wherein the concentration of the infrared absorbing compound differs in each formulation so as to provide different concentrations in successive sub-layers and the concentration of the infrared radiation absorbing compound is greater in any sub-layer that is closer to the bottom surface than the concentration in the adjacent sub-layer that is closer to the relief image-forming surface.

The following Examples are provided to illustrate the practice of this invention and are not meant to be limiting in any way.

EXAMPLES

The following components were used in preparing and carrying out the Examples:

PHMC represents polyhexamethylene carbonate diol, MW=2000 obtained from Sigma-Aldrich (St. Louis, Mo.).

Desmodur® N3300A is a hexamethylene diisocyanate based polyisocyanate obtained from Bayer Material Science (Pittsburgh, Pa.).

Mogul L is a carbon black obtained from Cabot Corporation (Billerica, Mass.).

Solsperse® 34750 is a 50 wt. % solution in ethyl acetate obtained from Lubrizol Limited (Manchester, UK).

Part A: Carbon Black Dispersion

Part A was prepared by mixing 494 g of PHMC with 60 grams of Mogul L and 46 g of Solsperse 34750, heating to 85° C. and milling using a Ross Mill equipped with a Cowles blade at 1200 rpm for 16 hours under vacuum to remove the ethyl acetate. The final concentration of the carbon black was 10.4 wt. % and the volume median particle size was 320 nm as determined using the Horiba particle size analyzer.

Melt A: Urethane Pre-Melt with 1 Wt. % Carbon Black

Melt A was prepared by adding 1.0 g of Part A to 7.8 g of PHMC at 85° C. and mixing with a overhead stirrer for 20 minutes, then adding 1.7 g of Desmodur® N3300A, and mixing for an additional 5 minutes. Acetone was added to dilute this to 50 wt. % solids.

Melts B-E:

Differing carbon black concentrations were prepared as with Melt A by changing the relative amounts of Part A, PHMC, and Desmodur® N3300A, and their final dry compositions are listed below in TABLE I. Melt D was diluted to 25 wt. % solids with acetone.

TABLE I

Melt Compositions

| Melt | Total PHMC (g) | Total Desmodur ® N3300A (g) | Total Mogul L (g) | Total Solsperse ® 34750 (g) | Wt. % carbon black | α ($\mu m^{-1}$) |
|---|---|---|---|---|---|---|
| A | 8.66 | 1.7 | 0.1 | 0.04 | 1 | 0.025 |
| B | 5.51 | 1.08 | 0.21 | 0.08 | 3 | 0.075 |
| C | 11.19 | 2.2 | 0.73 | 0.28 | 5 | 0.125 |
| D | 17.12 | 3.37 | 2.08 | 0.80 | 9 | 0.227 |
| E | 4.93 | 0.97 | 0.12 | 0.05 | 2 | 0.050 |

Invention Examples 1-3

Multi-sublayer laser-ablatable elements of this invention were prepared by casting a specified melt from TABLE I as the bottom layer into a 5"×5" (12.7 cm×12.7 cm) Teflon mold, and covering it loosely to allow for evaporation of the acetone coating solvent. The sample was dried overnight at ambient temperature, followed by 24 hours at 70° C. Then, the next layer, again chosen from a melt in TABLE I, was cast over this bottom layer and the drying procedure repeated. Multilayer samples were built using this procedure. The final structures of the multilayer elements are shown in DIAGRAM I and TABLE II below. In DIAGRAM I and TABLE II, "CB" refers to carbon black at a particular dry weight %, and the thickness of each sub-layer is given in micrometers (μm).

Comparative Examples 1-4

Single layer Comparative Example laser ablatable elements were prepared by casting the each of Melts A, B, and C from TABLE I into a 5"×5" (12.7 cm×12.7 cm) mold and heating at 60° C. for 24 hours.

DIAGRAM I

| Invention Example 1 | Invention Example 2 | Invention Example 3 |
|---|---|---|
| 1% CB/150 μm<br>3% CB/225 μm<br>5% cCB/107 μm<br>9% CB/254 μm | 1% CB/203 μm<br>3% CB/266 μm<br>5% CB/341 μm | 2% CB/236 μm<br>5% CB/598 μm |

Each laser-ablatable element was imaged using a 5.3 watt, 1064 nm pulsed single mode Ytterbium fiber laser with an 80 μm spot size. The pulse width was approximately 30 nsec and the pulse repetition rate was 20 kHz. The images used were 1 cm×1 cm patches rastered at 800 dpi at speeds from 13 inches/sec (ips) to 65 ips (33.02 cm/sec to 16.5 cm/sec), resulting in corresponding fluences of from 51 J/cm$^2$ to 102 J/cm$^2$. The depths of the ablated patches were measured using a self non-rotating spindle with ratchet stop micrometer. The inverse slope of the depth versus fluence is the sensitivity and is the energy required to ablate a μm in depth and is defined in units of (J/cm$^2$) per μm, or [(J/cm$^2$)/μm]. Lower values for the sensitivity indicate an increased ablation efficiency, and these lower values are desired. The "oily residue" that remained on the laser ablated sample was evaluated on a scale of 1-5, where (2) indicates minimal visible oil, (3) indicates visible but acceptable oil, (4) indicates unacceptable level of visible oil, and (5) indicates extremely objectionable visible oil. The results are shown below in TABLE II.

TABLE II

| Element | Number of sub-layers | % Carbon black in sub-layers from top to bottom | Oily residue at depth: >380 μm from image-forming surface (*) | Ablation sensitivity [(J/cm$^2$)/μm] Lasing from the image-forming surface | REVERSE GRADIENT Oily residue at depth: >380 μm from bottom surface (*) | REVERSE GRADIENT Ablation sensitivity [(J/cm$^2$)μm] Lasing from the bottom surface |
|---|---|---|---|---|---|---|
| Invention 1 | 2 | 2/5 | 3 | 0.37 | 3 | 0.47 |
| Invention 2 | 3 | 1/3/5 | 3 | 0.35 | 5 | 0.47 |
| Invention 3 | 4 | 1/3/5/9 | 2 | 0.34 | 4 | 0.74 |
| Comparative 1 | 1 | 1 | 4 | 0.37 | 4 | 0.37 |
| Comparative 2 | 1 | 3 | 5 | 0.40 | 5 | 0.40 |
| Comparative 3 | 1 | 5 | 3 | 0.46 | 3 | 0.46 |
| Comparative 4 | 1 | 9 | 3 | 0.57 | 3 | 0.57 |

(*) level of oily residue left on ablated sample after laser imaging.

These results demonstrate that the ablation efficiency of each of all three multi-sublayer elements of this invention was as good as the 1% and 2% carbon containing single layer samples but in addition, less oily residue remained after ablation. Comparative Examples 3 and 4 showed low oily residue but had worse ablation efficiency than the Invention elements. These data also show that if a reverse gradient in carbon black concentration is employed compared to the present invention (that is, highest carbon concentration at the image-forming surface), ablation efficiency was poor and oily residue was observed.

Invention Example 4

A carbon black dispersion was prepared by mixing 75 g of Mogul L carbon black (Cabot) with 195 g of acetone and 30 g of Solsperse® 32000 (Avecia Pigments and Additives, Charlotte, N.C.) and the mixture was milled in an Eiger Mill at 4500 rpm for 2.5 hours. The resulting median particle size (volume average) was 0.129 μm, as measured using the Horiba particle size analyzer. A 2.4 g sample of this carbon black dispersion was added to 40 g of a 25 wt. % solution of cellulose nitrate (viscosity 5/6 sec, Hercules Powder Co., Wilmington, Del.) in acetone and stirred with a magnetic stirrer. The mixture was placed in a 3 inch (7.6 cm) square Teflon mold and covered with aluminum foil having 3 holes punched in it for slow solvent evaporation. The sample was dried for 24 hours in the mold at ambient temperature. The sides of the mold were removed and the sample element was dried for another 24 hours at ambient temperature to form the plate element.

A thin (5 μm) cross-section of the dried element was cut using a Leica 2165 microtome, mounted in oil, and examined using an Olympus BX60 microscope using transmitted light. The results clearly showed that the concentration of carbon black particles is lower at the image-forming surface of the element than at its bottom surface.

The elements were laser-imaged in the same manner as for Invention Examples 1-3. The measured depth per specific fluence of the plate element when the "image-forming" surface (top, lower carbon black concentration) was ablated was much greater than when the "bottom" surface was ablated.

These examples demonstrate the utility of an increased absorption with depth with a laser source whose energy deposition rate is approximately adiabatic. These examples provide support for the premise that a nonuniform absorption profile is desirable. While these inventive examples may not be the optimal structure for allowing the energy to be absorbed uniformly with depth, they are consistent with it. It is easily understood that if the profile was closer to the optimum presented by the CAC profile or even the more practical but slightly less efficient DAC profile there would be less energy wasted and the ablation efficiency would be increased further.

The invention has been described in detail with particular reference to certain preferred embodiments thereof, but it will be understood that variations and modifications can be effected within the spirit and scope of the invention.

The invention claimed is:

1. A laser-ablatable element for direct laser engraving comprising at least one laser-ablatable, relief-forming layer that has a relief-image forming surface and a bottom surface, the relief-forming layer comprising a laser-ablatable polymeric binder and an infrared radiation absorbing compound that is present at a concentration profile such that its concentration is greater near the bottom surface than the relief-image forming surface, wherein the relief-forming layer has a dry thickness of from about 100 to about 4000 μm.

2. The element of claim 1 wherein the concentration profile of the infrared radiation absorbing compound provides a constant laser energy absorption profile with depth in the relief-forming layer.

3. The element of claim 1 wherein the infrared radiation-absorbing compound is present in the relief-forming layer in a concentration profile throughout depth x from the relief-image forming surface so that the absorption coefficient profile α(x) is substantially in accordance with the following equation:

$$\alpha(x) = \frac{1}{\beta - x} \text{ wherein } \beta \leq \frac{F}{\rho C_p (T_c - T_0)}$$

wherein F is the fluence (energy per unit area) of the infrared radiation source at the relief-forming layer surface, ρ is the density of the relief-forming layer, $C_p$ is the heat capacity of the relief-forming layer, $T_0$ is the initial temperature of the relief-forming layer, and $T_c$ is critical ablation temperature of the relief-forming layer.

4. The element of claim 1 wherein the relief-forming layer has a dry thickness of from 200 to 2000 μm.

5. The element of claim 1 further comprising a non-laser ablatable substrate having an imaging side and a non-imaging side, and having the relief-forming layer disposed on the imaging side.

6. The element of claim 1 that is a flexographic printing plate precursor or flexographic printing sleeve precursor.

7. The element of claim 1 further comprising a non-laser ablatable substrate and an elastomeric rubber layer between the substrate and the relief-forming layer.

8. The element of claim 1 further comprising a non-laser ablatable substrate having an imaging side and a non-imaging side and having at least one non-ablatable layer on the non-imaging side the substrate.

9. The element of claim 1 wherein the laser-ablatable polymeric binder is a crosslinked elastomeric or rubbery resin.

10. The element of claim 9 wherein the crosslinked elastomer is derived by the reaction of a polyol with a polyisocyanate or the reaction of a polyamine with a polyisocyanate.

11. The element of claim 1 wherein the polymeric binder consists of a thermoplastic elastomer and a thermally initiated reaction product of a multifunctional monomer or oligomer.

12. The element of claim 1 wherein the infrared radiation absorbing compound is a carbon black, an organic or inorganic pigment, an organic dye that has a $\lambda_{max}$ of from about 800 to about 1200 nm, or any combination of these.

13. The element of claim 1 wherein the infrared radiation absorbing compound is a magnetic compound where the concentration profile can be produced by the application of a magnetic field.

14. The element of claim 1 wherein the infrared radiation absorbing compound is present in an amount of from about 1 to about 20 weight % based on the dry weight of the relief-forming layer.

15. The element of claim 1 wherein the relief-forming layer further comprises micropores, microcapsules, or inorganic particles, or any combination thereof.

16. The element of claim 1 wherein the relief-forming layer is composed of two or more sub-layers having different concentrations of the infrared radiation absorbing compound such that its concentration is progressively greater in the sub-layers closer to the bottom surface than at the relief-image forming surface.

17. A method of providing a relief image comprising imagewise exposing the laser-ablatable element of claim 1 to infrared radiation provided by at least one laser having a minimum output fluence at the element surface of 1 J/cm$^2$.

18. The method of claim 17 wherein the imagewise exposed element is a flexographic printing plate, flexographic printing sleeve, or flexographic printing cylinder.

19. The method of claim 17, wherein the relief image has a minimum depth of at least 100 μm.

20. The method of claim 17, wherein the imagewise exposure is carried out using a fluence of from about 20 to about 1000 J/cm$^2$.

21. The method of claim 17, wherein the imagewise exposure is carried out at a wavelength of from about 800 to about 1200 nm.

22. The method of claim 17, wherein the relief image has a depth of from about 50 to about 600 μm.

23. The method of claim 17, wherein the laser-ablatable element is imagewise exposed adiabatically.

24. A method of preparing the laser-ablatable element of claim 1 comprising forming a laser-ablatable relief image-forming layer with an image-forming surface and a bottom surface, by applying a formulation comprising a coating solvent, a laser-ablatable polymeric binder, and an infrared radiation absorbing compound, in such a manner that the infrared radiation absorbing compound is present at a concentration profile such that its concentration is greater near the bottom surface than the image-forming surface after the coating solvent is removed.

* * * * *